(12) United States Patent
Eitelhuber

(10) Patent No.: US 9,355,873 B2
(45) Date of Patent: May 31, 2016

(54) APPARATUSES, SYSTEMS AND METHODS FOR CLEANING PHOTOVOLTAIC DEVICES

(75) Inventor: Georg Eitelhuber, Jeddah (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 923 days.

(21) Appl. No.: 13/567,205

(22) Filed: Aug. 6, 2012

(65) Prior Publication Data

US 2013/0037051 A1    Feb. 14, 2013

Related U.S. Application Data

(60) Provisional application No. 61/515,177, filed on Aug. 4, 2011.

(51) Int. Cl.
*A47L 5/38* (2006.01)
*H01L 21/67* (2006.01)
*H02S 40/10* (2014.01)

(52) U.S. Cl.
CPC .......... *H01L 21/67046* (2013.01); *H02S 40/10* (2014.12)

(58) Field of Classification Search
CPC .......................... H01L 21/67046; H02S 40/10
USPC ........... 15/21.2, 105, 3, 4, 77, 88.4, 102, 301, 15/303

IPC .......................................................... A47L 5/38
See application file for complete search history.

(56) References Cited

U.S. PATENT DOCUMENTS 6,385,805 B2 *    5/2002    Konishi ................... B08B 1/04
                                                    134/902
8,316,866 B2 *    11/2012    Freer ........................ B08B 3/00
                                                    134/60

FOREIGN PATENT DOCUMENTS

JP              2011040592 A  *  2/2011

* cited by examiner

*Primary Examiner* — David Redding
(74) *Attorney, Agent, or Firm* — Steptoe & Johnson LLP

(57) ABSTRACT

Embodiments of solar panel cleaning apparatuses, solar panel cleaning systems, and solar panel cleaning methods are disclosed. In certain embodiments, the disclosed solar panel cleaning apparatuses, systems and methods do may not require any water or other cleaning liquids in the whole cleaning process, which makes them prominent well suited in for water-deficit environments such as deserts. In one embodiment, the solar panel cleaning apparatus comprises one or more rotatable brushes each having a rotational axis and a drive configured to move each of the one or more rotatable brushes in a direction that is not perpendicular to the rotational axis. The solar panel cleaning apparatus is may be configured such that the angle of the rotational axis of at least one of the one or more rotatable brushes is adjustable relative to the direction of travel.

30 Claims, 20 Drawing Sheets

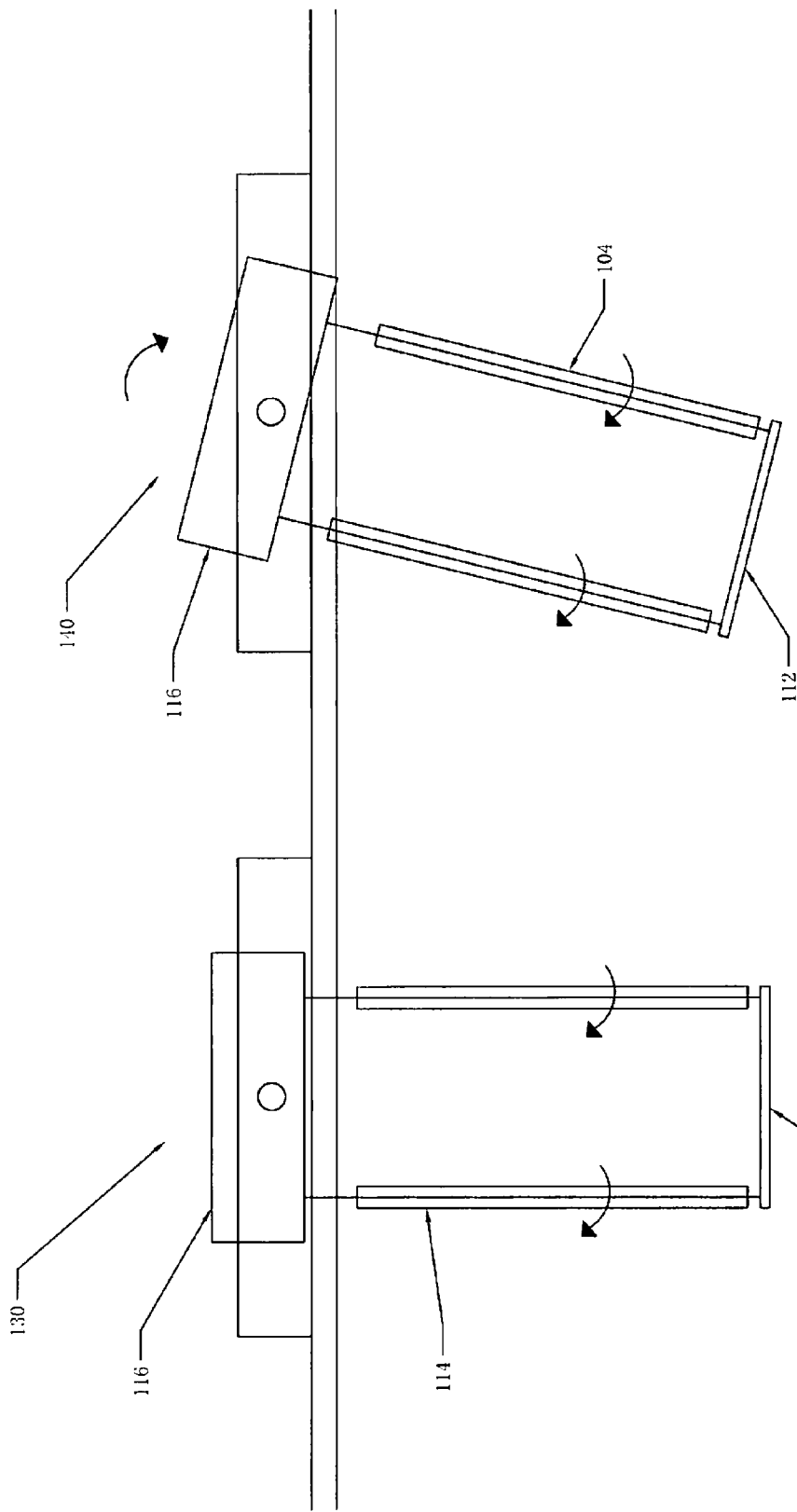

APPARATUSES, SYSTEMS AND METHODS FOR CLEANING PHOTOVOLTAIC DEVICES

CROSS-REFERENCE TO RELATED APPLICATIONS

This application claims priority to U.S. Provisional Application No. 61/515,177 filed Aug. 4, 2011, the entire contents of which is specifically incorporated herein by reference without disclaimer.

BACKGROUND OF THE INVENTION

1. Field of the Invention

The present invention relates generally to cleaning systems for photovoltaic installations, more particularly, apparatuses, systems, and methods for cleaning photovoltaic devices.

2. Description of the Related Art

The efficiency of a solar panel is measured by the ratio of the amount of sunlight it receives to the amount of electricity it generates. After a solar panel is installed, dust and other debris typically begins to accumulate on the solar panel surfaces. Dust accumulated on a solar panel often reduces the number of photons that the solar panel can convert to electric energy during a unit of time, and therefore may significantly reduce the efficiency of the solar panel. As such, many systems comprise a solar panel cleaning system to improve the efficiency of solar panels. Typically, most solar panel cleaning systems use liquid cleaning solutions or water for cleaning the solar panels.

Dust and other debris may also become moist from rain, dew, and other condensation on the panels. The moistened dust and debris may become sticky and adhere to the surfaces of the solar panel. This typically complicates the cleaning process, and is one reason that most cleaning systems use liquid cleaning solutions in the cleaning process.

In the field of solar panel cleaning systems, one common practice is water-rich solutions, which use a large amount of water to wash away dusts on a solar panel. This water-rich solution, however, is high cost and impractical in water-deficient environments such as deserts. Another common practice in the field of solar panel cleaning systems is to use dust-repelling coating, which does not involve intensive water use. Unfortunately, dust-repelling coating cannot effectively remove all dust on a solar panel, but even a very low percentage of dust retention on a solar panel will cause a reduction in the solar panel efficiency. Furthermore, any moisture from humidity condensation or sporadic rain will cause the dust to turn into mud and stick to the solar panels, making dust-repelling coatings ineffective.

SUMMARY OF THE INVENTION

Embodiments of solar panel cleaning apparatuses, solar panel cleaning systems, and solar panel cleaning methods are disclosed. The disclosed solar panel cleaning apparatuses, systems and methods can efficiently clean dust and debris from a surface of a solar panel. In certain embodiments, the disclosed solar panel cleaning apparatuses, systems and methods may not require water or other cleaning liquids in the cleaning process, which makes them well suited for water-deficit environments such as deserts.

Embodiments of a solar panel cleaning apparatus are disclosed. In one embodiment, the solar panel cleaning apparatus comprises one or more rotatable brushes each having a rotational axis and a drive configured to translate each of the one or more rotatable brushes in a direction that is not perpendicular to the rotational axis. The solar panel cleaning apparatus may be configured such that the angle of the rotational axis of at least one of the one or more rotatable brushes is adjustable relative to the direction of translation In one embodiment, the solar panel cleaning apparatus may further comprise a rotation drive coupled to the one or more rotatable brushes and configured to rotate the one or more rotatable brushes. The solar panel cleaning apparatus may also comprise a track coupled to the one or more rotatable brushes via a support assembly, and the track may be configured to guide the one or more rotatable brushes along a path, where the path is in a direction that is not perpendicular to the rotational axis. The solar panel cleaning apparatus may also comprise a support assembly configured to support the one or more brushes.

In one embodiment, the solar panel cleaning apparatus may comprise a first drive mechanism to support and drive the rotatable brushes. The solar panel cleaning apparatus may further comprise a second drive mechanism configured to assist maintaining uniform brush contact and pressure along the length of a solar panel face, increase operating stability and reduce vibration.

In one embodiment, the drive of the solar panel cleaning apparatus comprises one or more motors. The one or more motors may be configured to operate the one or more rotatable brushes. Each of the one or more rotatable brushes of the solar panel cleaning apparatus may comprise a shaft extending along the rotational axis and a sweeping member coupled to the shaft and configured to be rotatable about the rotational axis. The shaft and the sweeping member may be further configured to be pivotable about an axis perpendicular to a plane of the solar panel array.

In one embodiment, the pivot angle between the one or more brushes and the direction of travel of the solar panel cleaning apparatus is between zero (0) and ninety (90) degrees. In certain embodiments, the rotation drive of the solar panel cleaning apparatus comprises a worm drive. The solar panel cleaning apparatus may further comprise a bevel gear reduction gearbox. The bevel gear reduction gearbox allows a single motor to simultaneously actuate the rotation and pivoting of the rotatable brushes as well as the lateral translation of the solar panel cleaning apparatus. In an another embodiment, the rotation drive of the solar panel cleaning apparatus comprises one or more sprockets or gears configured to translate rotation of the shaft into mechanical power for moving the rotational brushes along the path. In certain embodiments, the support assembly of the solar panel cleaning apparatus comprises one or more thrust slide bearings.

A solar panel cleaning system is also disclosed. In one embodiment, the solar panel cleaning system comprises a solar panel power system comprising one or more solar panels, and a solar panel cleaning apparatus coupled to the one or more solar panels. The solar panel cleaning apparatus may comprise one or more rotatable brushes each having a rotational axis and a drive configured to move each of the one or more rotatable brushes in a direction that is not perpendicular to the rotational axis.

In one embodiment, the solar panel cleaning system may further comprise a rotation drive coupled to the one or more rotatable brushes and configured to rotate the one or more rotatable brushes. The solar panel cleaning system may further comprise a track coupled to the one or more rotatable brushes and configured to guide the one or more rotatable brushes along a path, where the path is in a direction that is not perpendicular to the rotational axis. In a further embodiment, the solar panel cleaning system comprises a support assembly configured to support the one or more brushes.

In one embodiment, the drive of the solar panel cleaning system comprises one or more motors. The one or more motors are configured to operate the one or more rotatable brushes. In a further embodiment, each of the one or more rotatable brushes of the solar panel cleaning system comprises a shaft extending along the rotational axis and a sweeping member coupled to the shaft and configured to be rotatable about the rotational axis.

In one embodiment, the angle between the one or more brushes and the direction of travel of the solar panel cleaning system is between zero (0) and ninety (90) degrees. In certain embodiments, the rotation drive of the solar panel cleaning system comprises a worm drive. In certain embodiments, the support assembly of the solar panel cleaning system comprises one or more thrust slide bearings.

A method for cleaning solar panels is also disclosed. In one embodiment, the method comprises rotating one or more rotatable brushes around a rotational axis such that the one or more rotatable brushes contact the solar panel, and moving the one or more rotatable brushes in a direction that is not perpendicular to the rotational axis. In one embodiment, the one or more rotatable bushes of the solar panel cleaning method are adjustable such that the one or more rotatable brushes are not perpendicular to the direction of travel.

In a further embodiment, the method may comprise guiding the one or more rotatable brushes along a path with a track, where the path is in a direction that is not perpendicular to the rotational axis. The method may also comprise supporting, with a support assembly, the one or more rotatable brushes, such that the one or more rotatable bushes are in contact with a surface of the one or more solar panels. Additionally, the method may comprise operating the one or more rotatable brushes with one or more motors, adjusting the one or more rotatable brushes such that the angle between the one or more rotatable brushes and the direction of travel is between zero (0) and ninety (90) degrees, and resting the one or more rotatable brushes in a dock after the cleaning process.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

FIGS. 1A-1C are diagrams illustrating various views of one embodiment of a solar panel cleaning system.

DETAILED DESCRIPTION

Various features and advantageous details are explained more fully with reference to the non-limiting embodiments that are illustrated in the accompanying drawings and detailed in the following description. Descriptions of well-known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Figure 1A:
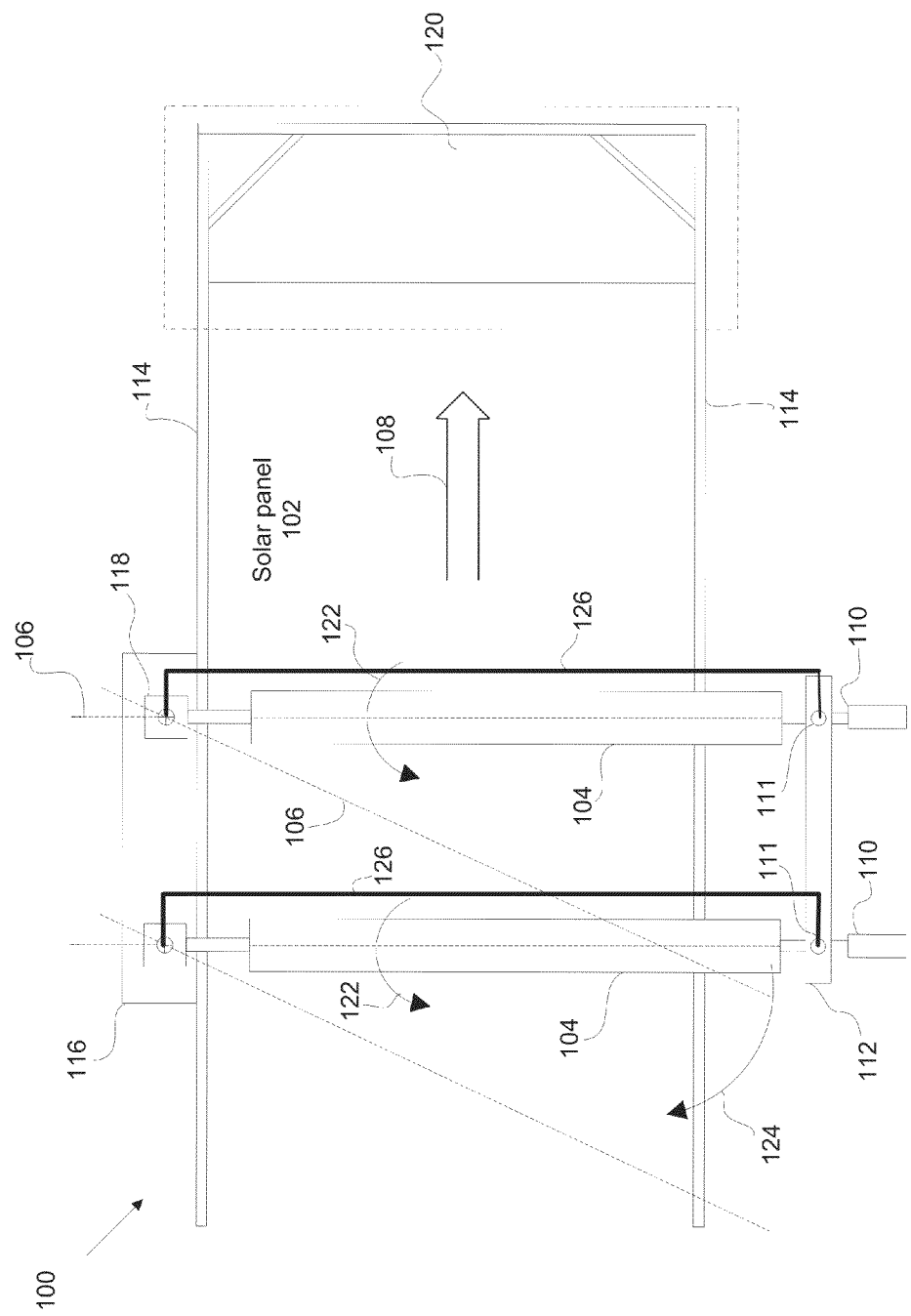
Figure 2:
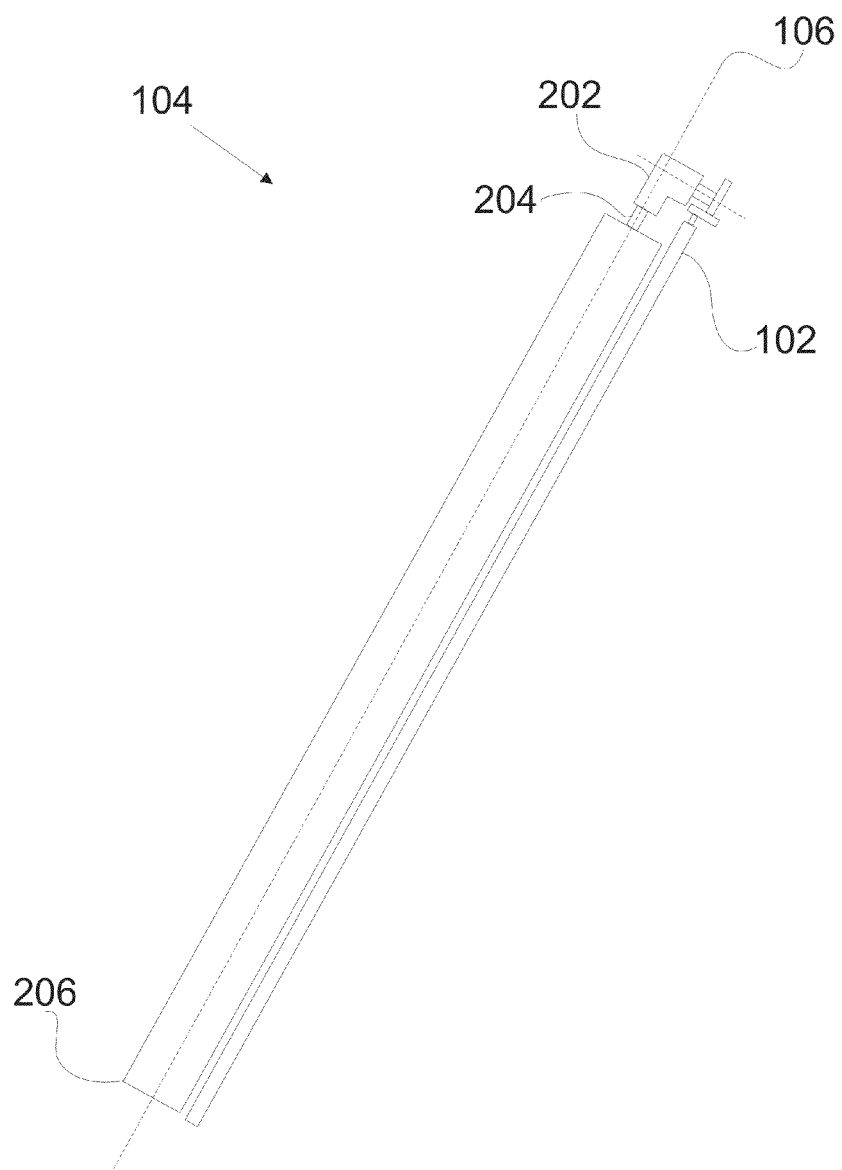
FIG. 2 is a schematic diagram illustrating a perspective view of one embodiment of a rotatable brush.

FIG. 1A illustrates one embodiment of a solar panel cleaning system 100. The solar panel cleaning system 100 may comprise one or more solar panels 102. Additionally, the solar panel cleaning system 100 may comprise one or more rotatable brushes 104. Rotatable brushes 104 may be configured to be rotatable along a rotational axis 106. For example, rotatable brushes 104 may rotation in direction 122 or the opposite direction of 122. Details about the structure of the rotatable brushes 104 are depicted in FIG. 2.

In one embodiment, the solar panel cleaning system 100 may also comprise a support assembly 114. The system 100 may also comprise one or more motors 110. Motors 110 may be configured to rotate or pivot rotatable brushes 104, and/or move rotatable brushes 104 along direction 108 or the opposite direction of 108. In a further embodiment, the system 100 may comprise a support structure 112 configured to support rotatable brushes 104. Support structure 112 may be coupled to the motors 110. In one embodiment, the system 100 may comprise a first drive assembly 116. The first drive assembly 116 may further comprise a drive transmission 118. In a further embodiment, the system 100 may comprise a dock 120. As illustrated in FIG. 1A, the dock 120 may be attached on one side of the one or more solar panels 102.

Figure 3A:
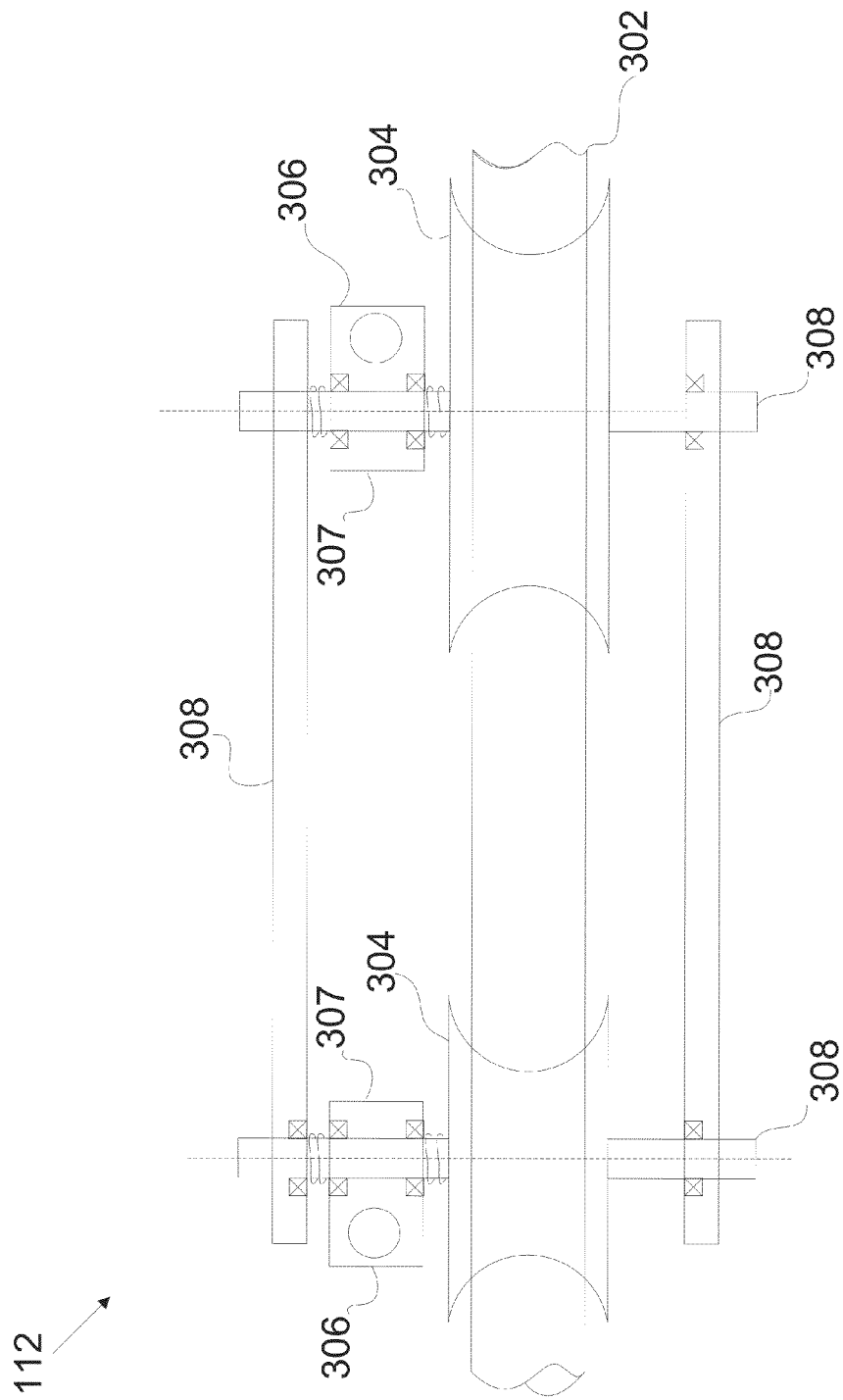
FIGS. 3A-3D are diagrams illustrating various views of one embodiment of a support structure for a solar panel cleaning system.
Figure 3B:
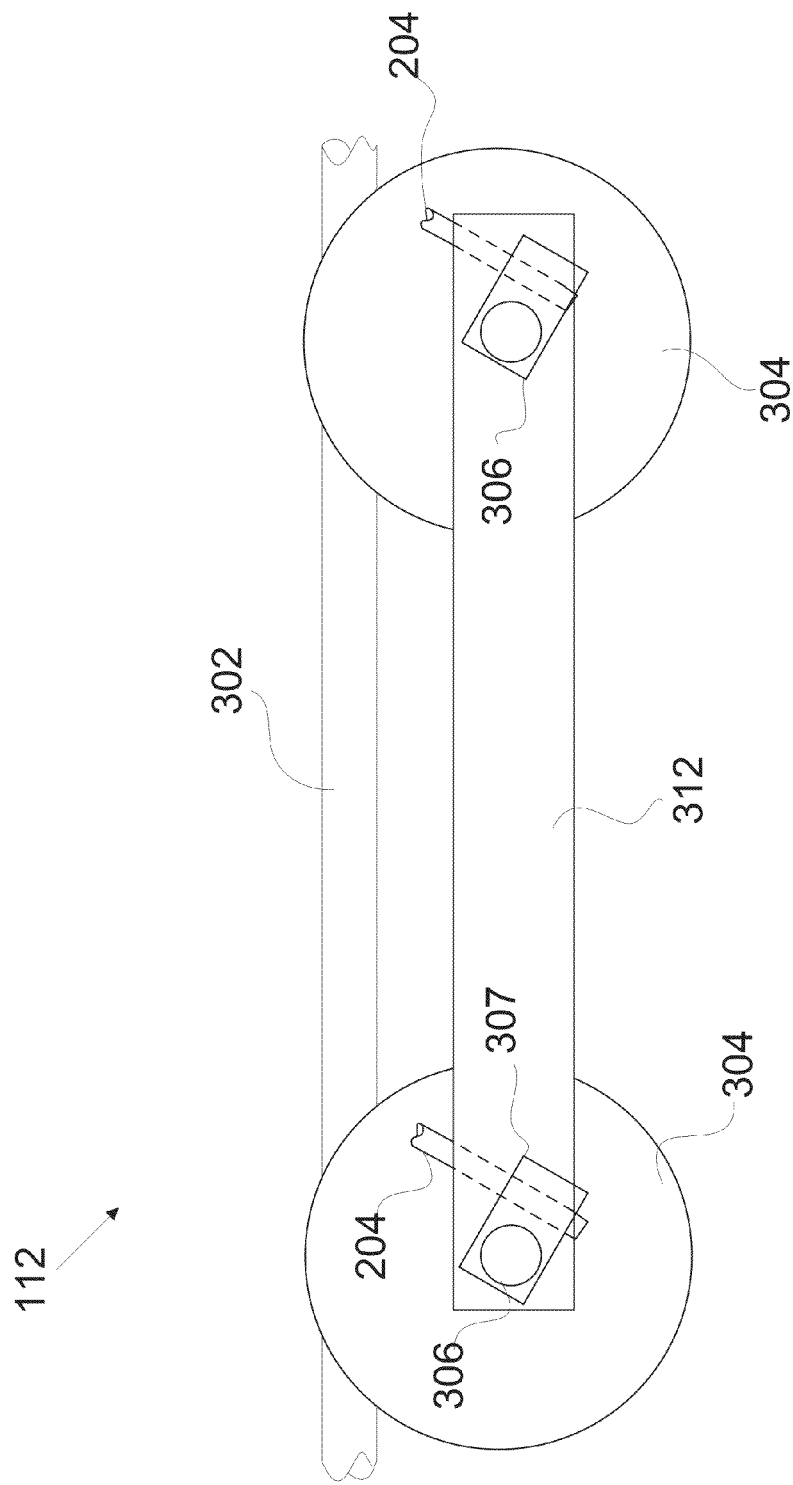
Figure 3C:
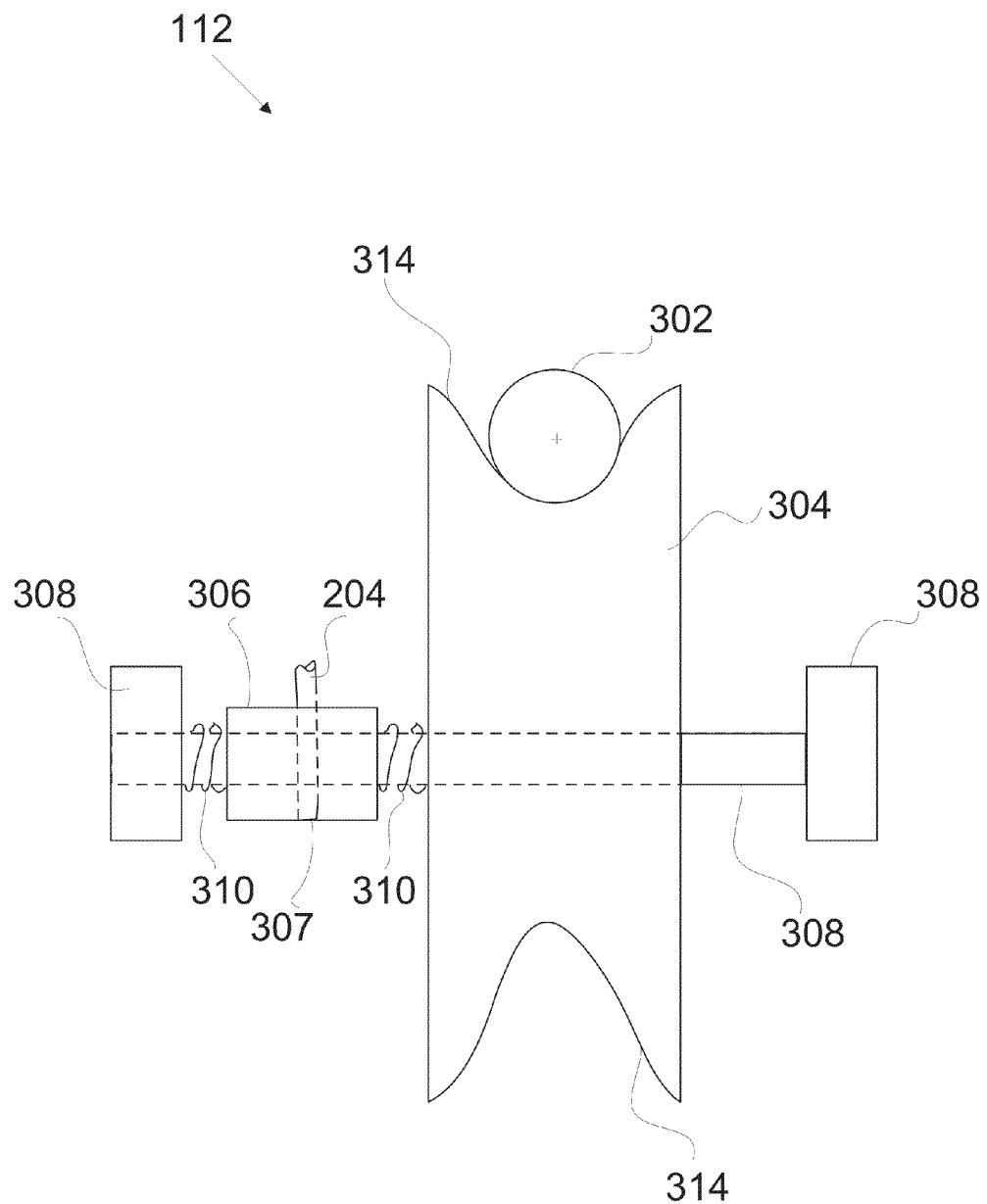
Figure 4A:
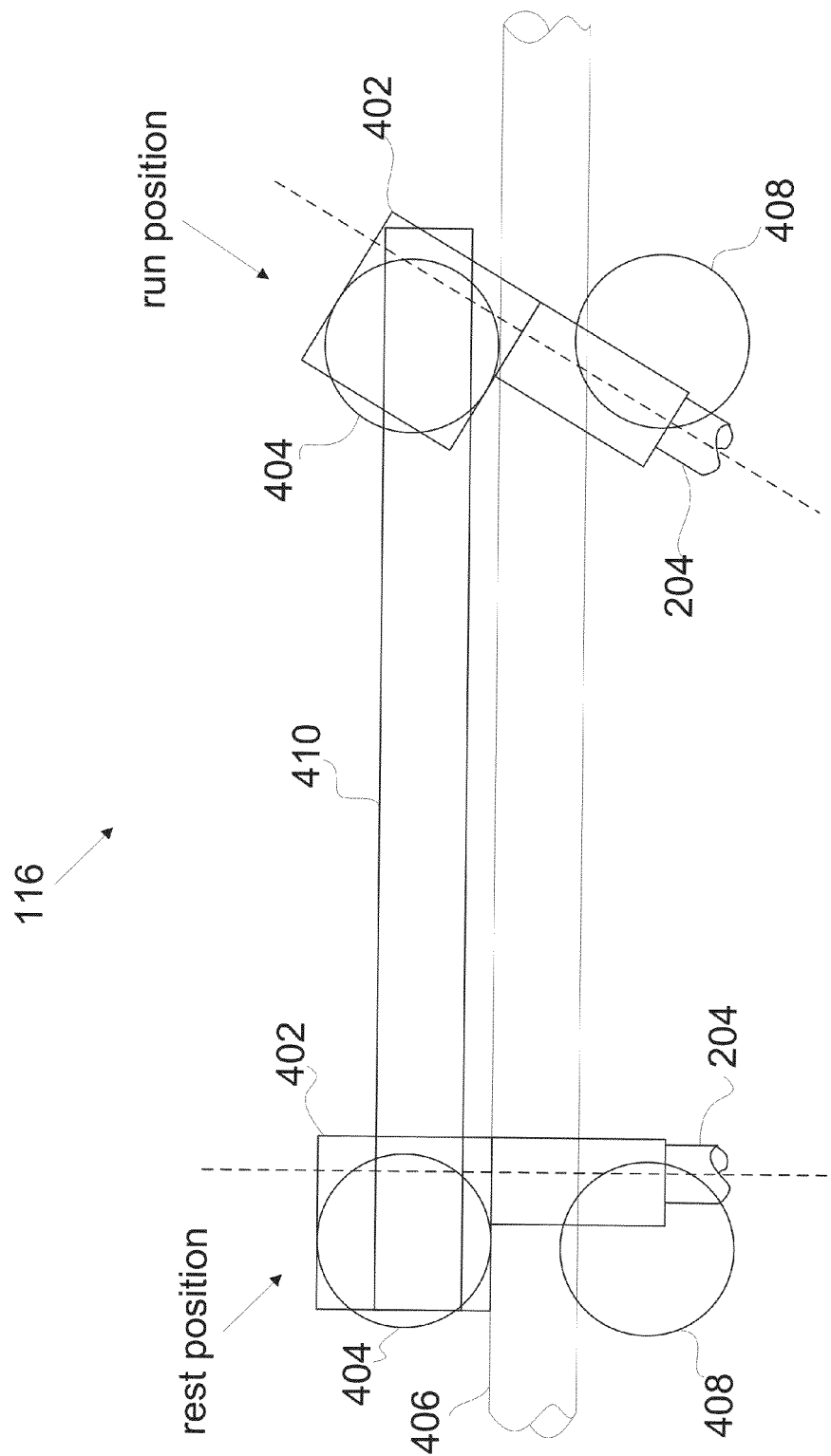
FIGS. 4A-4D are diagrams illustrating various views one embodiment of a drive mechanism for a solar panel cleaning system.
Figure 4B:
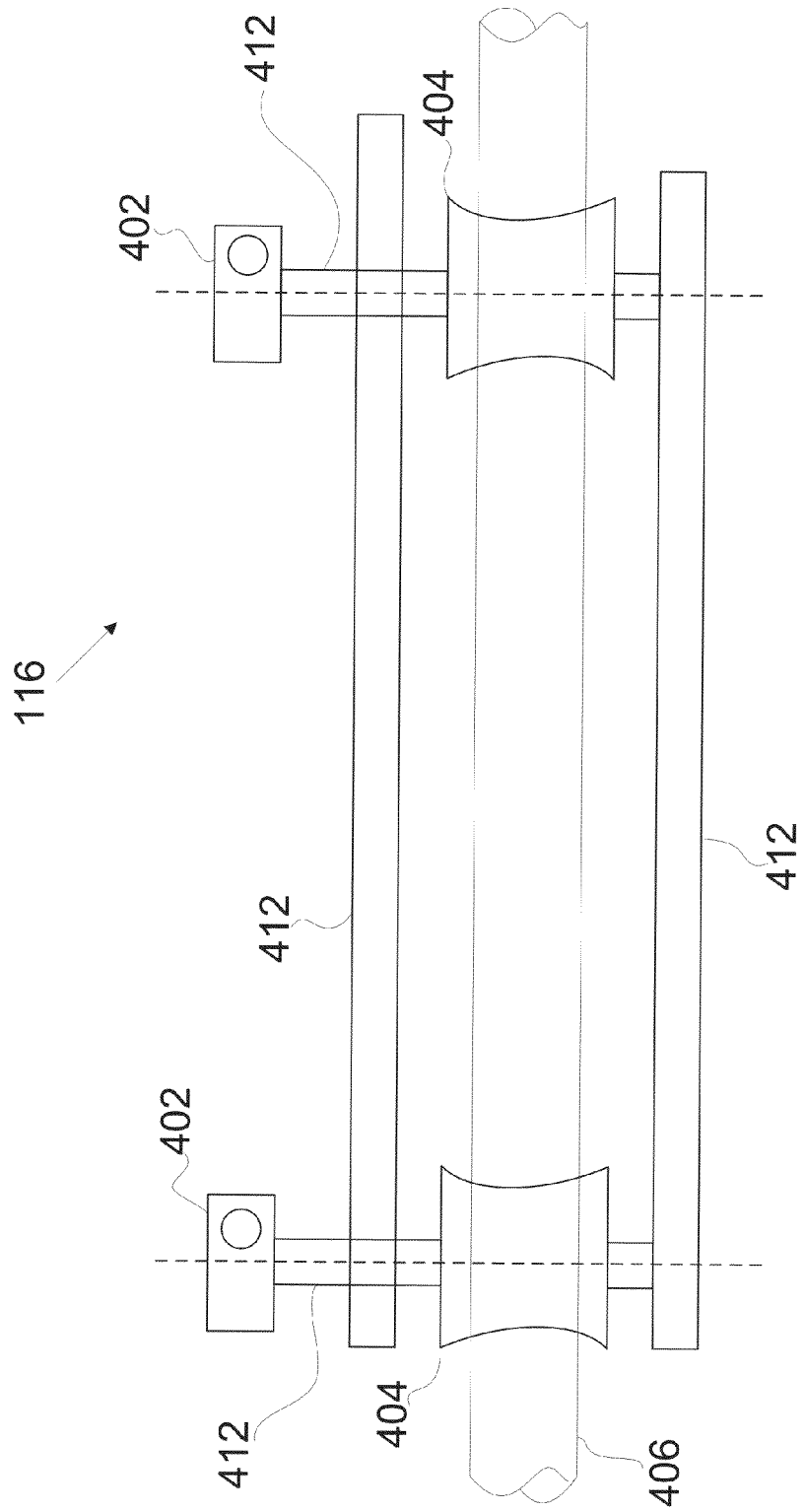
Figure 4C:
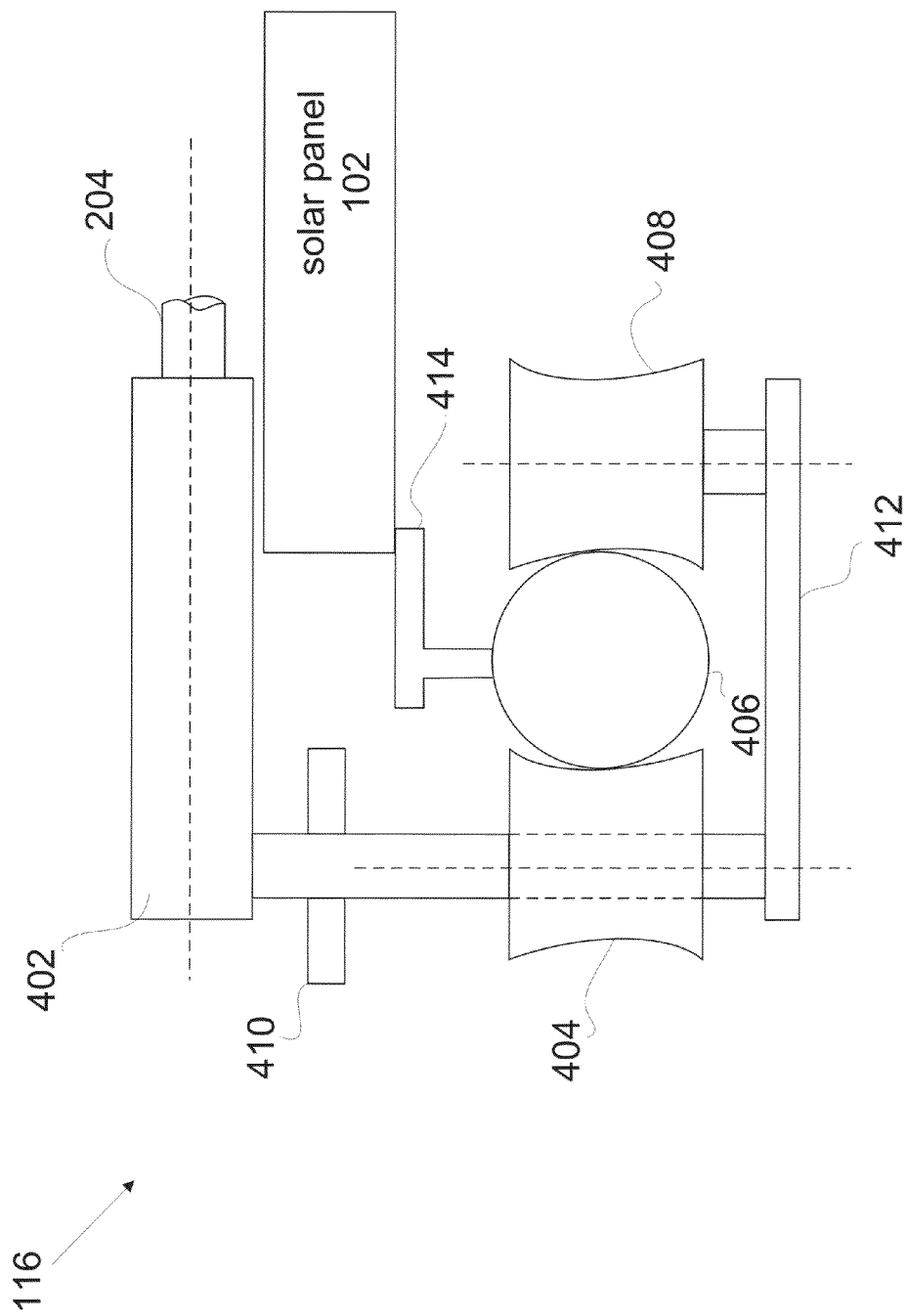

In one embodiment, the support assembly 114 may comprise a frame or support structure coupled to the solar panel. In another embodiment, the support assembly 114 may comprise an drive track 406 as shown in FIGS. 4A-4C and a guide track 302 as shown in FIGS. 3A-3C. In still a further embodiment, the support assembly 114 may comprise both the frame and tracks 302, 406.

In one embodiment, the one or more motors 110 are configured to operate the one or more rotatable brushes 104. As used herein, the term "operate" means rotating the brushes 104 along the rotational axis 106. The term "operate" may further mean moving the brushes 104 along the direction 108 or the opposite direction of 108. Also, the term "operate" may mean pivoting (e.g. in direction 124 or the opposite) the rotatable brushes 104 to a position where the rotational axis 106 is not perpendicular to the direction 108. Additionally, "operate" may mean lowering the brushes 104 such that the brushes are in contact with a surface of the solar panels 102.

In one embodiment, the system 100 may comprise only one motor 110. In this specific embodiment, the one or more rotatable brushes 104 may be configured to rotate together in the same direction along the rotational axis 106. In an another embodiment, the system 100 may comprise two or more motors 110. In this embodiment, the one or more rotatable brushes 104 may be configured to rotate in different directions along the rotational axis 106. The system 100 may further comprise a pivot 111 coupled to each of the rotatable brushes 104 and configured to rotate the rotatable brushes 104.

In some embodiments, motors 110 may be attached to a top edge of rotatable brushes 104, or a bottom edge of rotatable brushes 104, or a location between the top and bottom edge of rotatable brushes 104. In some embodiments, motors may be configured to move with rotatable brushes 104 along direction 108 or the opposite direction. In some embodiments, motor 110 may be configured to pivot with rotatable brushes 104 clockwise or counter-clockwise in the plane of the one or more solar panels 102. In some embodiments, motors 110 do not move with rotatable brushes 104.

In one embodiment, the rotatable brushes 104 may move in a direction opposite to direction 108. In this specific embodiment, when in a run position, the angle between the rotational axis 106 and the direction 108 may be between ninety (90) and one hundred and eighty (180) degrees. When the brushes 104 are in rest position, the rotational axis 106 may be perpendicular to the direction 108. In this specific embodiment, the rotatable brushes 104 may be rotated counter-clockwise from a rest position until the support structure 112 contacts the guide track 302 or a lower edge of the one or more solar panels 102 to reach a run position.

In one embodiment, the rotatable brushes 104 are configured to move in a direction 108 that is not perpendicular to the rotational axis 106 while rotating along the rotational axis 106. In one embodiment, the rotatable brushes 104 are configured to engage a surface of the one or more solar panels 102 when the brushes 104 are in motion. In one embodiment, the rotatable brushes 104 rests in the dock 120 after the cleaning process.

In some embodiments, rotatable brushes 104 may be further configured to pivot in the plane of the one or more solar panels 102. For example, rotatable brushes 104 may be configure to pivot in direction 124 or the opposite direction of 124. Rotatable brushes 104 may be in either a rest position 130 or a run position 140, as illustrated in FIG. 1B. When in a rest position 130, rotatable brushes 104 may be substantially perpendicular to direction 108. When in a run position 140, the angle between the rotational axis 106 and the direction 108 may be an angle between zero (0) and ninety (90) degrees.

In one embodiment, one or more rotatable brushes 104 are pivoted clockwise (direction 124) from a rest position until the support structure 112 contacts the guide track 302 or a lower edge of the one or more solar panels 102 to reach a run position. Alternatively, the rotatable brushes 104 may be pivoted counter-clockwise (the opposite of direction 124) to reach a run position. In one embodiment, the one or more rotatable brushes 104 may be configured to be in parallel to each other while either in a rest position or in a run position.

In some embodiments, only the one or more rotatable brushes 104 pivots clockwise or counter-clockwise. In some embodiments, support structure 112 and/or first drive assembly 116 pivot together with rotatable brushes 104, as illustrated in FIG. 1B.

Figure 1C:
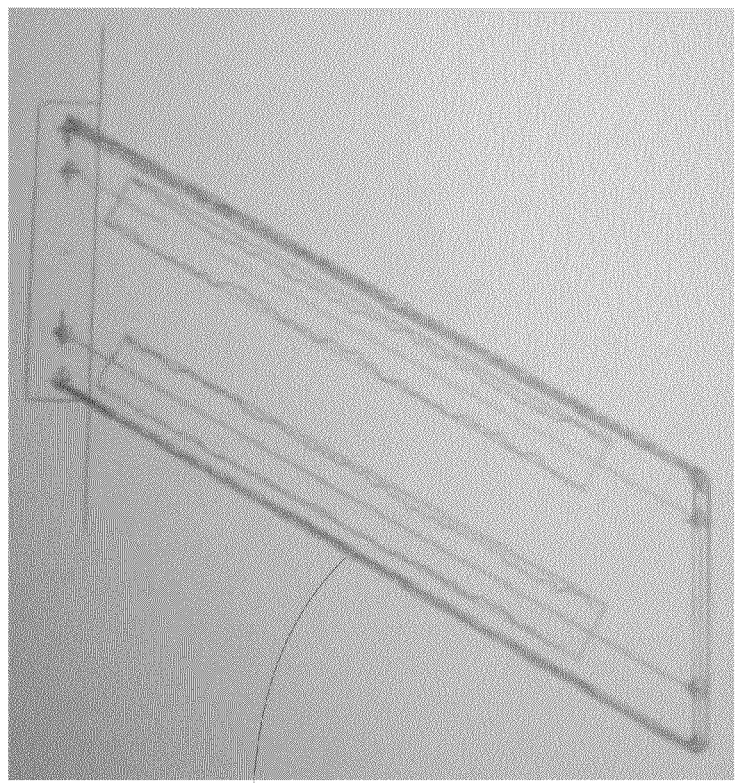

In some embodiments, system 100 may comprise a support member 126 for each of the one or more rotatable brushes 104 configured to support the rotatable brushes, as illustrated in FIGS. 1A and 1C. In some embodiments, support member 126 may be configured to move with rotatable brushes 104 along direction 108 or the opposite of direction 108. Support member 126 may be further configured to pivot with rotatable brushes 104 clockwise or counter-clockwise, as illustrated in FIG. 1C.

FIG. 2 illustrates one embodiment of a rotatable brush 104. In one embodiment, the rotatable brush 104 may comprise a shaft 204 and a sweeping member 204. The shaft 204 may be coupled to a drive transmission 202 and the shaft 204 may be configured to be rotatable along axis 106. In one embodiment, the sweeping member 206 may comprise bristles. In an alternative embodiment, the sweeping member 206 may comprise foam. In an alternative embodiment, the sweeping member 206 may comprise a sponge. One of ordinary skill in the art of solar panel cleaning system may recognize other alternatives for the sweeping member 206.

FIG. 3A illustrates a top view of one embodiment of the support structure 112 as shown in FIG. 1. In one embodiment, the support structure 112 may comprise one or more guide rollers 304 for each of the one or more rotatable brushes 104. The support structure 112 may also comprise one or more pivots 306 for each of the one or more rotatable brushes 104. The support structure 112 may further comprise a support structure 308 configured to hold the support structure 112 assembly together.

In one embodiment, the guide rollers 304 may be configured to engage a guide track 302. While in motion, the guide rollers 304 may be configured to hold tight with the guide track 302 such that the guide rollers 304 would move in a path defined by the guide track 302. In one embodiment, the pivots 306 may be configured to pivot clockwise or counter-clockwise. In various embodiments, guide track 302 is shown at the lower end of the system for illustrative purposes. This is not intended to be limiting. For example, one of ordinary skill in the art will recognize that the guide track 302 need not necessarily be positioned at a lower end. Rather, the track 302 may alternatively be positioned at the top or at the sides of the any particular system, depending upon the system configuration.

In one embodiment, there may be only one motor 110. In such an embodiment, the one or more pivots 306 may be powered by the same motor. As such, the one or more pivots 306 may be configured to pivot in the same direction synchronously. In an another embodiment, there may be two or more motors 110. In such an embodiment, the one or more pivots 306 may be powered by different motors. As such, the one or more pivots 306 may be configured to pivot in the same direction asynchronously.

FIG. 3B is a side view of one embodiment of the support structure 112. In the depicted embodiment, the support structure 112 may comprise one or more guide rollers 304. The guide rollers 304 may be configured to engage the guide track 302. The support structure 112 may also comprise one or more pivots 306. In one embodiment, the support structure 112 may further comprise a joint bar 314.

In one embodiment, each of the one or more pivots 306 may be coupled to each of the one or more rotatable shafts 204. In one embodiment, each of the one or more pivots 306 and each of the one or more rotatable shafts 204 may be connected by a drive 307. In such an embodiment, the rotation of the rotatable shaft 204 can be transferred through the drive 307 to pivot the pivots 306 clockwise or counter-clockwise. In one embodiment, the motor 110 may be coupled to the shaft 204 providing a rotation force on the brushes 104. In particular, one or more motors 110 may be coupled directly to the shaft 204. In such an embodiment, the drive 307 may translate rotation of the shaft 204 into rotation of the guide rollers 304. Alternatively, the one or more motors 110 may be coupled directly to the guide rollers 304 or an axle coupled to the guide rollers 304. In such an embodiment, the drive 307 may translate rotation of the guide rollers into a rotation force on the shaft 204 causing the rotatable brushes 104 to rotate or pivot. One of ordinary skill in the art will recognize alternative arrangements of the motors 110, drive 307, rotatable brushes 104 and guide rollers 304 that may be suitable for use with the present embodiments.

In certain embodiments, the drive 307 connecting each of the one or more pivots 306 and each of the one or more rotatable shafts 204 may be a worm drive 307. In an alternative embodiment, the drive 307 connecting the pivot 306 and the rotatable shaft 204 may be a sprocket drive 307. One of ordinary skill in the art of solar panel cleaning system may recognize other alternatives for the drive 307 connecting the pivot 306 and the rotatable shaft 204.

In one embodiment, the joint bar 312 may be configured to hold the pivots 306 together as shown in FIG. 3B. The joint bar 312 may also be configured to separate the one or more pivots 306. In one embodiment, joint bar 312 may be configured to keep the distance between the one or more pivots 306 constant. The joint bar 312 may also be configured to move together with the one or more pivots 306 when the pivots 306 rotates clockwise or counter-clockwise.

FIG. 3C is another side view of one embodiment of the support structure 112 revealing more details about one part of the support structure 112. In the depicted embodiment, the support structure 112 may comprise a plurality of springs 310 coupled to the support structure 308 around the pivot 306. The springs 310 may be configured to hold the pivot 306 in position such that each of the pivot 306 will not hit the guide roller 304 on one side and the support structure 308 on the other side when the pivot 306 rotates clockwise or counter-clockwise.

In one embodiment, the guide roller 302 may be configured to be in contact the guide track 302. In certain embodiments, the guild roller 302 may be in pie-shaped as shown in FIG. 3B. The thickness of the guide roller 302 may be larger than the diameter of the guide track 302. In certain embodiments, the guide roller 302 may also have a curved-in edge 314. The curved-in edge 314 may be wider than the diameter of the guide track 302. In such an embodiment, the curved-in edge 314 may be configured to embrace and contact the guide track 302.

Figure 3D:
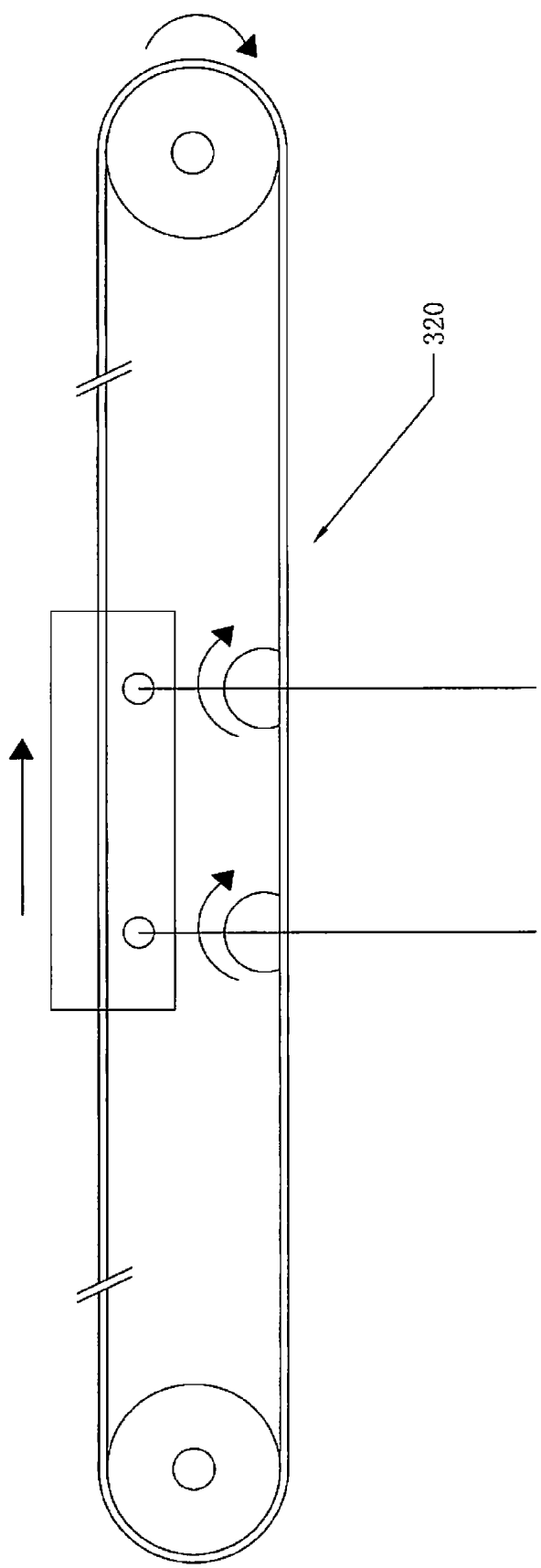

In some embodiments, support structure 112 may comprise a cable 320 (or belt) that runs the length of the one or more solar panels 102, as illustrated in FIG. 3D. The cable 320 (or belt) may be driven by one or more statically mounted motors 110 attached to an end of one or more solar panels 102. The cable 320 (or belt) can also be used to drive rotatable brushes 104 using relative lateral motion of the cable. In some embodiments, cable 320 (or belt) may be powered by one or more pulleys that are powered by one or more motors 110 attached to the solar panel structure.

In some embodiments, cable 320 (or belt) may be looped around the rotating axis 106 of rotatable brushes 104, causing brush rotation as the structure moves laterally, thus using a single motor for rotation and lateral movement (e.g. in direction 108) of rotatable brushes 104.

In some embodiments, support structure 112 may comprise a caster wheel to allow the rotatable brushes 104 move easily in direction 108 or the opposite direction.

FIG. 4A is a top view of the first drive assembly 116 shown in FIG. 1. In one embodiment, the first drive assembly 116 may comprise one or more drive transmissions 402. For illustrative purpose, the drive transmission 402 on the left side of FIG. 4A is shown in rest position, and the drive transmission 402 on the right side of FIG. 4A is shown in run position. In one embodiment, the first drive assembly 116 may comprise one or more drive wheels 404. The first drive assembly 116 may also comprise one or more engagement member 408. In one embodiment, the first drive assembly 116 may further comprise a joint bar 410.

In one embodiment, the drive transmission 402 may be coupled to the one or more rotatable shafts 204. The drive transmission 402 may also be configured to engage the drive track 406. In one embodiment, the drive transmission 402 may be configured to transform the torque from the rotatable shafts 202 into the rotation of the drive wheel 404. In certain embodiment, the drive transmission 402 may be a worm drive. In an alternative embodiment, the drive transmission 402 may be a sprocket drive. One of ordinary skill in the art of solar panel cleaning system may recognize other alternatives for the drive transmission 402.

In one embodiment, the drive wheel 404 and the engagement member 408 may be placed on the opposite sides of the drive track 406. In one embodiment, drive wheel 404 may be positioned on the side of the drive track 402 that is distal to the rotatable shaft 204. In such an embodiment, the engagement member 408 may be place on the side of the drive track 406 that is proximal to the rotatable shaft 204. The engagement member 408 may be configured to contact the drive track 406.

In one embodiment, the engagement member 408 may be a runner wheel. In an alternative embodiment, the engagement member 408 may be a slide bearing. One of ordinary skill in the art of solar panel cleaning system may recognize other alternatives for the engagement member 408, such as a nylon slide member, a metal guide hook, or the like.

In one embodiment, the joint bar 410 may be configured to hold the one or more drive transmissions 402 together. The joint bar 410 may also be configured to separate the one or more drive transmission 402. In one embodiment, joint bar 410 may be configured to keep the distance between the one or more drive transmissions 402 constant. The joint bar 410 may also be configured to move together with the one or more drive transmissions 402 when the rotatable shafts 204 rotates clockwise or counter-clockwise. In one embodiment, the joint bar 306 as shown in FIG. 3B and the joint bar 410 as shown in FIG. 4A may be configured to hold the one or more rotatable shafts 204 in parallel to each other.

FIG. 4B is a side view of the drive transmission 116. In the depicted embodiment, the drive transmission 116 may be supported by a support member 412. The support member 412 may form a rectangular shape that frames the drive track 406 inside. The one or more drive transmissions 402 may be coupled to the support member 412.

FIG. 4C illustrates a side view of the drive transmission 116 looking from the left hand side of FIG. 1. In the depicted embodiment, the drive transmission 116 may comprise a mounting point 414. In one embodiment, the mounting point 414 may be configured to engage a surface of the solar panel on one side. In such an embodiment, the mounting point 414 may be also configured to engage the drive track 406 on the other side. Although it is not shown in FIG. 3, the guide track 302 may also comprise a mounting point 414. In various embodiments, the mounting point 414 may be integral with the solar panel 102 and/or the tracks 302, 406.

In one embodiment, the solar panel 102 may be configured to engage the one or more brushes 104 as shown in FIG. 1 on the top side of the solar panel 102. In such an embodiment, the solar panel 102 may also be configured to engage the mounting point 414 on the bottom side of the solar panel 102.

In one embodiment, the drive wheel 404 may be pie-shaped as shown in FIG. 4A. In one embodiment, the edge of the runner wheel 404 may be configured to be thicker than the diameter of the drive track 406. The runner wheel 404 may also have a concave edge. In such an embodiment, the concave edge of the runner wheel 404 may be configured to embrace and contact the drive track 406.

In one embodiment, the edge of the engagement member 408 may be configured to be thicker than the diameter of the drive track 406. The engagement member 408 may also have a concave edge. In such an embodiment, the concave edge of the engagement member 408 may be configured to embrace and contact the drive track 406. In one embodiment, the concave edges of the drive wheel 404 and the engagement member 408 may be configured to contact and embrace the drive wheel 306 on the opposite sides.

In one embodiment, the support member 412 may be configured to hold the drive wheel 404 and the engagement member 408 together. The support member 412 may also be configured to keep the drive wheel 404 and the engagement member 408 in a distance such that both the drive wheel 404 and the engagement member 408 contact the drive track 406. In certain embodiments, the support member 412 may be a tension member. In such an embodiment, the tension member may be configured to adjust the distance between the drive wheel 404 and the engagement member 408 so that the drive wheel 404 and the engagement member 408 may pinch tightly to the drive track 406.

Figure 4D:
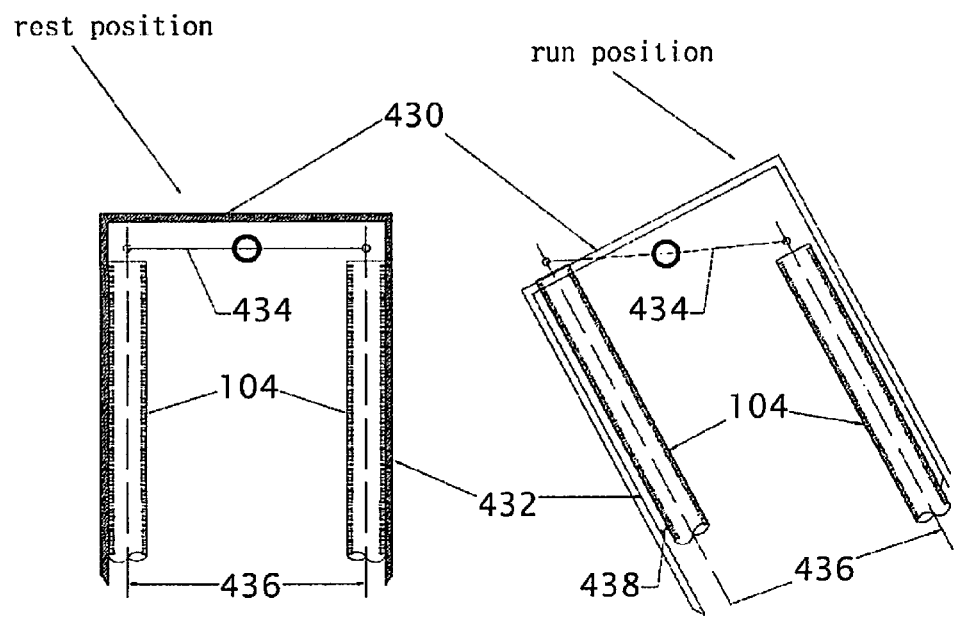

In some embodiment, system 100 may further comprise a self-cleaning assembly 430, as illustrated in FIG. 4D, configured to automatically clean the one or more rotatable brushes 104. In some embodiments, self-cleaning assembly 430 may comprise a cover 432 on top of each of the one or more rotatable brushes 104. Cover 432 may be rectangular, cylindrical, or of other shapes.

During operation, rotatable brushes 104 pivot clockwise or counter-clockwise, and the cover 432 pivots on a single centered axis 434. While pivoting with the rotatable brushes 104, cover 432 hinges downward, a surface of the cover 432 engages rotatable brushes 104, and cleans the rotatable brushes 104. When rotatable brushes 104 are in rest position, the clearance 438 disappears as the brushes move to a vertical position. This is because the center distance 436 between the brushes is increased as they approach a vertical position. When rotatable brushes 104 are in rest position, the rotatable brushes 104 can be rotated while in contact with a cleaning edge on the inside of the cover 432, and the rotatable brushes 104 may be cleaned.

In some embodiments, system 100 may further comprise one or more sensor configured to be able to communicate with other systems through a wireless link. For example, system 100 may be connected with multiple systems and/or devices to form a network. Sensors in system 100 may be configured to monitor the operation and condition of system 100 and send corresponding information to a control center. The control center may be configured to receive information from system 100, and/or sending instructions to system 100 to monitor, control, and/or operate system 100. For example, sensors attached to system 100 may be configured to detect and identify malfunctions of system 100, maintenance requirements, whether conditions, and/or other information, and send the information (e.g. an error code or other codes to identify types of malfunctions, types of maintenance required, level of whether condition, etc.) to a control center through a wireless network. Upon receiving information from system 100, control center may analyze the information and send instructions to system 100 according to result of analysis.

In some embodiments, sensors attached to system 100 may be configured to monitor climatic condition which system 100 is in, such as temperature, humility, solar panel surface moisture, and the like. Based the climatic information, system 100 may optimize the frequency of cleaning the solar panels 102, and/or the rotatable brushes 104, or select a mode of operation for system 100. In some embodiments, system 100 may be configured to receive climatic and/or other information from a control center through one or more sensors connected to a network. Based on the received climatic and/or other information, system 100 may optimize the frequency of cleaning the solar panels 102, and/or the rotatable brushes 104, or select a mode of operation.

In some embodiments, rotatable brushes 104 may be configured to move along a direction 108 or the opposite direction without rotating along axis 106. In some embodiments, system 100 may be configured to provide water or other kinds of cleaning fluid to rotatable brushes 104 for cleaning of solar panels 102. For example, rotatable brushes 104 may be configured to spay water or other kinds cleaning fluid on solar panels 102 while moving along direction 108 or the opposite direction.

Figure 5:
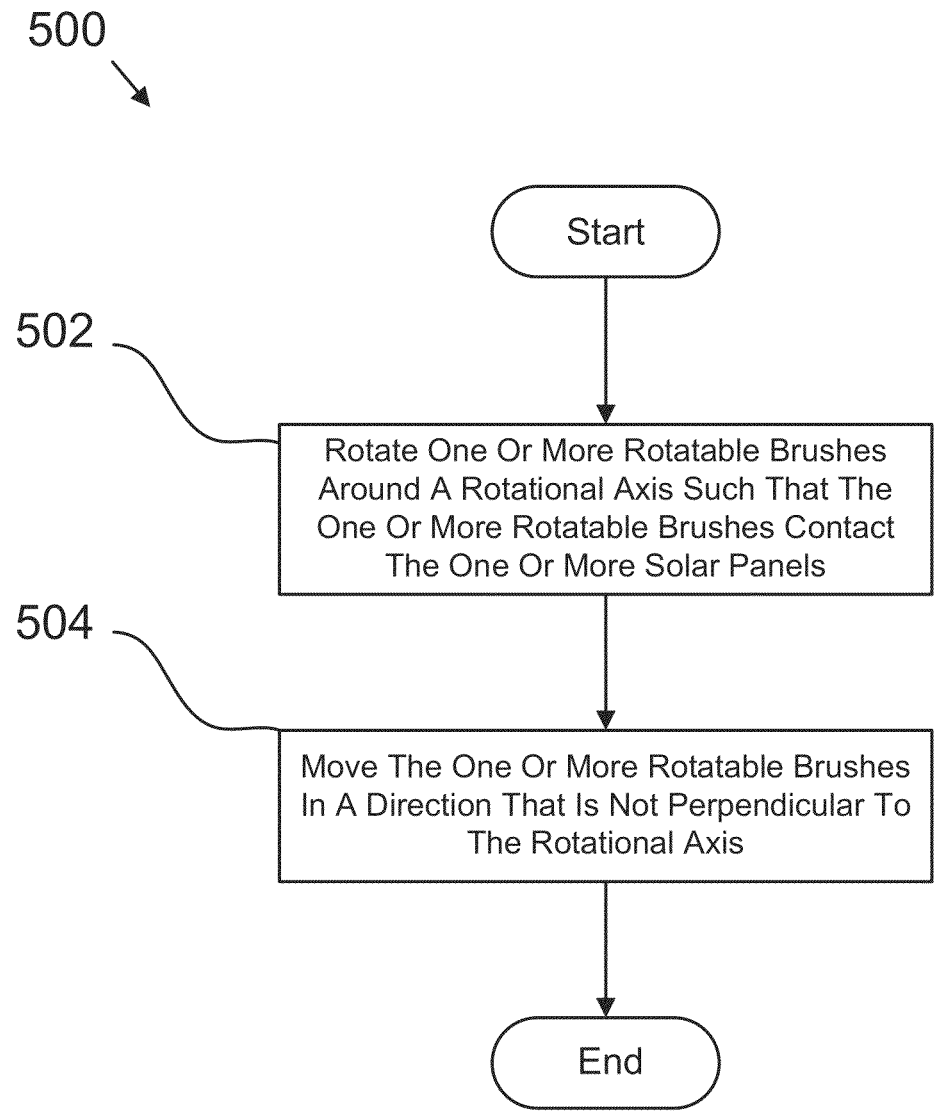
FIG. 5 is a schematic flow chart diagram illustrating one embodiment of a method for cleaning solar panels.

FIG. 5 illustrates one embodiment of a method 500 for cleaning one or more solar panels 102. In one embodiment, the method 500 may comprise rotating 502 the one or more rotatable brushes 104 along the rotational axis 106 such that the one or more brushes 104 contact the one or more solar panels 102. Additionally, the method 500 may comprise moving 504 the one or more rotatable brushes 104 in the direction of travel 108 that is not perpendicular to the rotational axis 106.

Figure 6:
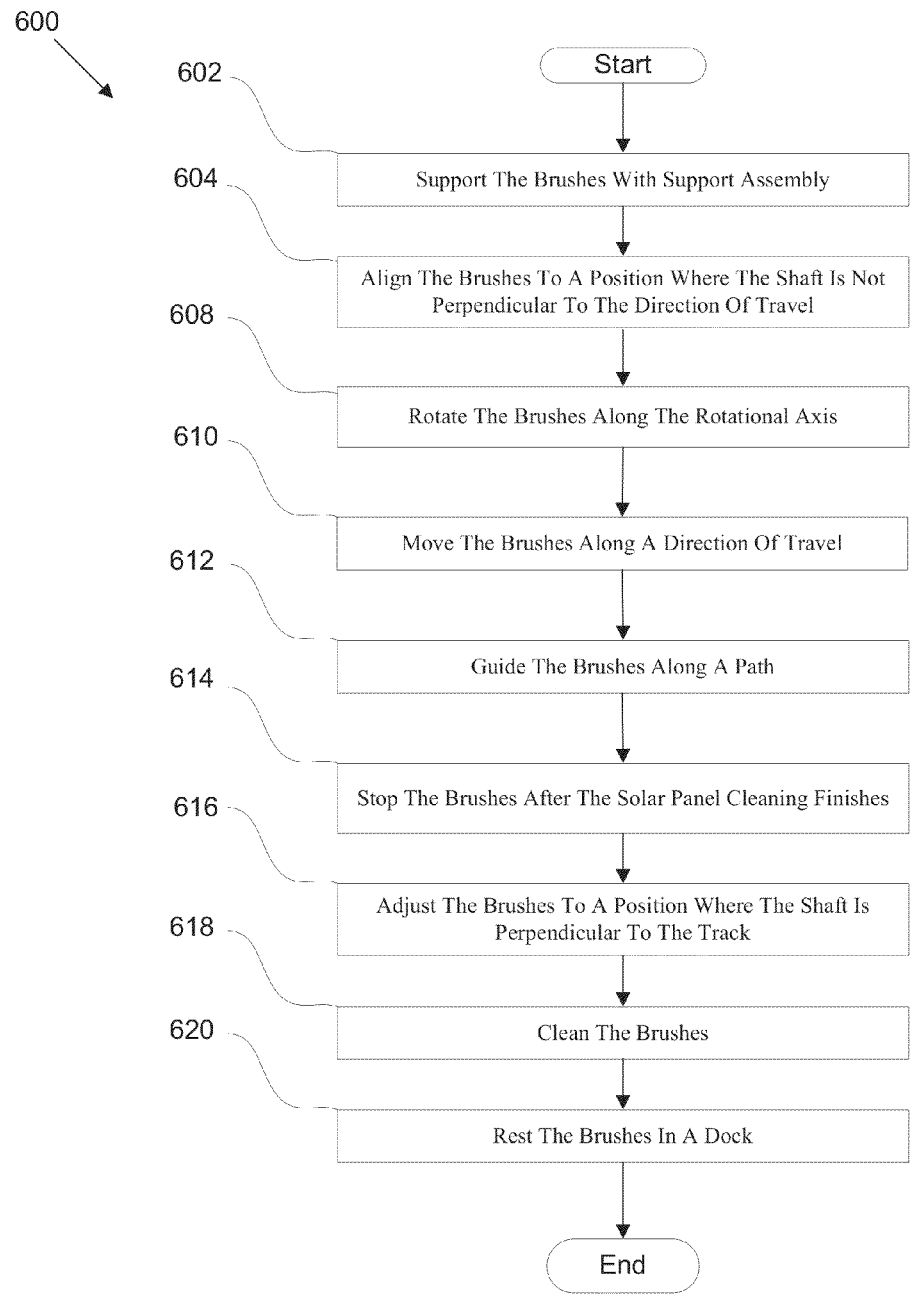
FIG. 6 is a schematic flow chart diagram illustrating one embodiment of a method for cleaning solar panels.

FIG. 6 illustrates another embodiment of a method 600 for cleaning one or more solar panels 102. In one embodiment, the method 600 may comprise supporting 602, with a support assembly 114, the one or more rotatable brushes 104 such that the one or more rotatable brushes 104 are on top of the one or more solar panels 102. Additionally, the method 600 may comprise aligning 604 the one or more rotatable brushes 104 to a position where the angle between the one or more rotatable brushes 104 and the direction of travel 108 may be between zero (0) and ninety (90) degrees. Specifically, aligning 604 the one or more rotatable brushes 104 may comprise keeping the drive wheels 404 in contact with the edge of the solar panels 102 and rotating the rotatable brushes 104 clockwise or counter-clockwise until the support structure 112 is in contact with the guide track 302 or the lower edge of the one or more solar panels 102.

In one embodiment, the method 600 may further rotating 608 the one or more rotatable brushes 104 along the rotational axis 106. The method 600 may also comprise moving 610 the one or more rotatable brushes along the direction of travel 108. The direction of travel 108 may not be perpendicular to the rotational axis 106. In one embodiment, the method 600 may comprise guiding 612 the one or more brushes along a path. The path may be not perpendicular to the rotational axis 106. In addition, the path may be defined by the guide track 302 and the drive track 406.

In one embodiment, the solar panel cleaning method 600 may comprise stopping 614 the rotatable brushes 104 from rotating and moving along the direction of travel 108 after a solar panel cleaning process. Additionally, the method 600 may comprise adjusting 616 the one or more rotatable brushes 104 such that the rotatable axis 106 is perpendicular to the direction of travel 108. In some embodiments, method 600 may comprise cleaning 618 the rotatable brushes 104 (e.g. with a self-cleaning assembly). In certain embodiments, the method 600 may further comprise resting 620 the one or more rotatable brushes 104 in a dock 120.

Figure 7:
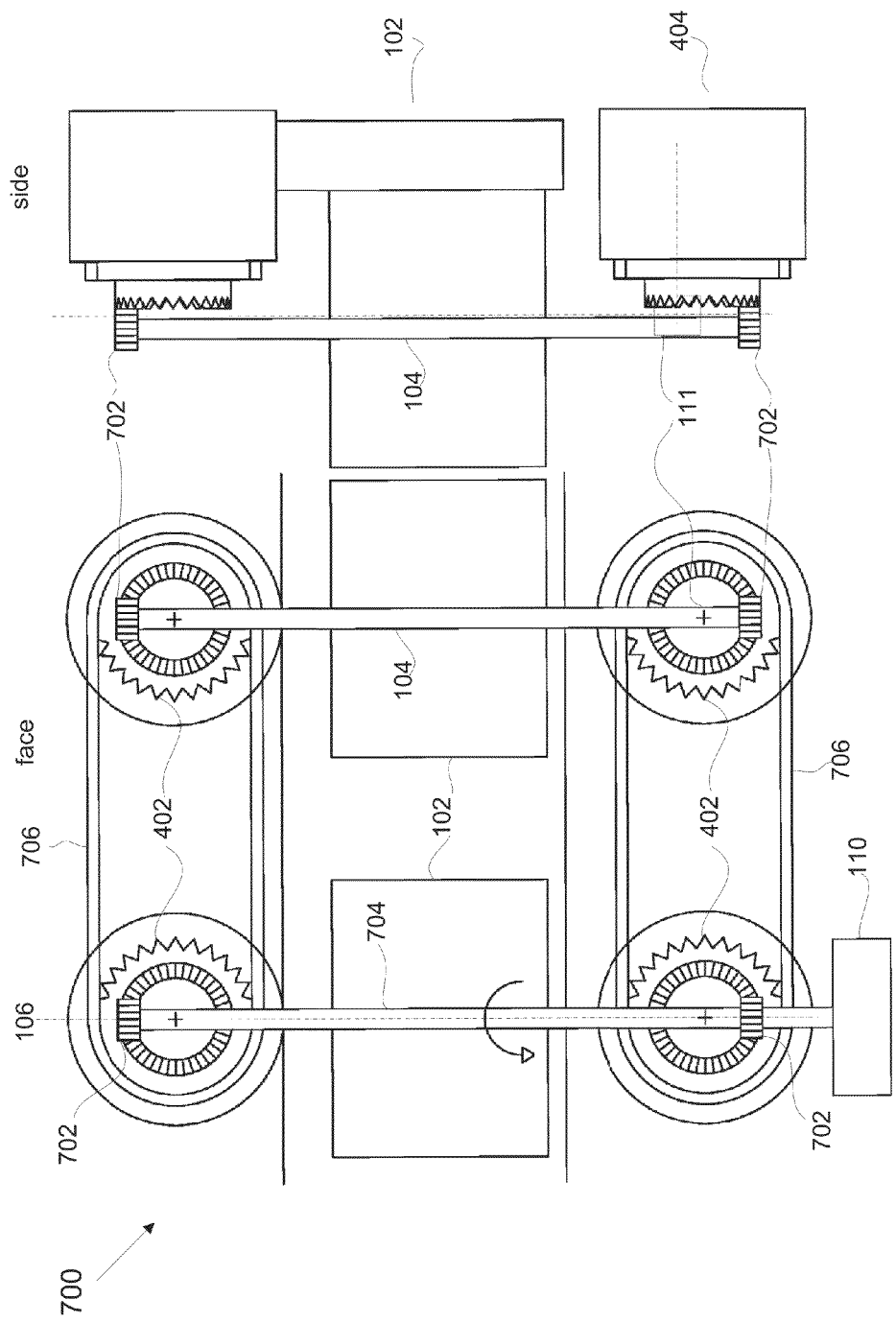
FIG. 7 is a schematic diagram illustrating one embodiment of a solar panel cleaning system with only one motor.

FIG. 7 illustrates one embodiment of a solar panel cleaning system 700 with only one motor 110. The system 700 may comprise a solar panel bank 102. The system 700 may also comprise a main rotatable brush 704 coupled to the motor 110. The main brush 700 may be configured to be rotatable along the rotational axis 106. The system 700 may further comprise one or more drive transmissions 402. Each of the drive transmission 402 may be coupled to a rotatable brush 104 or 704. In one embodiment, the system 700 may also comprise one or more gear sets 702 coupled to each of the rotatable brushes 104 or 704. The system 700 may also comprise one or more drive links 706 coupled to the drive transmissions 402.

In one embodiment, the drive transmission 402 may be coupled to the gear set 702 and the rotatable brushes 104 or 704. The drive transmission 402 may also be configured to transfer the rotation of the rotatable brushes 104 or 704. In one embodiment, the drive transmission may be a sprocket drive. In an another embodiment, the drive transmission 402 may be a pulley drive.

In one embodiment, the motor 110 may be coupled to a main rotatable brush 704 and configured to operate the main brush 704. The rotation of the main brush along the rotational axis 106 may be transferred, through the gear set 702, the drive transmission 402 and the drive link 706, to one or more additional rotatable brushes 104 and operate the additional brushes 104. In one embodiment, the drive link 704 may be a chain. In an alternative embodiment, the drive link 706 may be a belt.

Figure 8A:
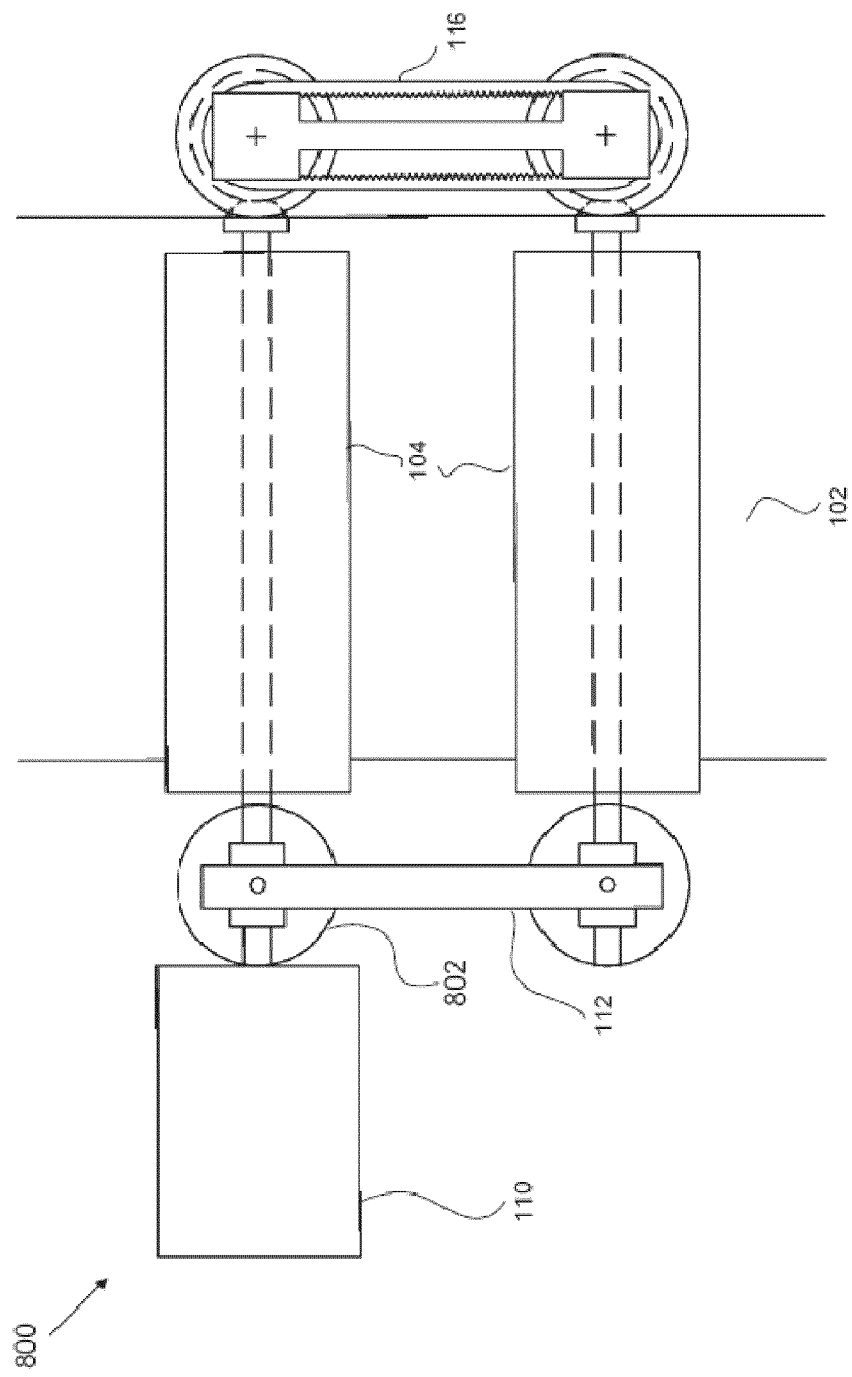
FIGS. 8A-8D illustrate one embodiment of a solar panel cleaning system with only one motor.

FIG. 8A shows one embodiment of a solar panel cleaning system 800 with one motor 110. In one embodiment, a solar panel bank 102. The system 800 may comprise a first drive assembly 116 coupled to an edge of the solar panel bank 102. In such an embodiment, the system 800 may also comprise a support structure 112 coupled to an edge of the solar panel system 800. The first drive assembly 116 and the support structure 112 may be configured to coupled to two parallel edges of the solar panel bank 102. In one embodiment, the system 800 may comprise one or more rotatable brushes 104. In the depicted embodiment, the rotatable brushes 104 are in rest position. In certain embodiment, the system 800 may also comprise one or more bevel gearboxes 802.

Figure 8B:
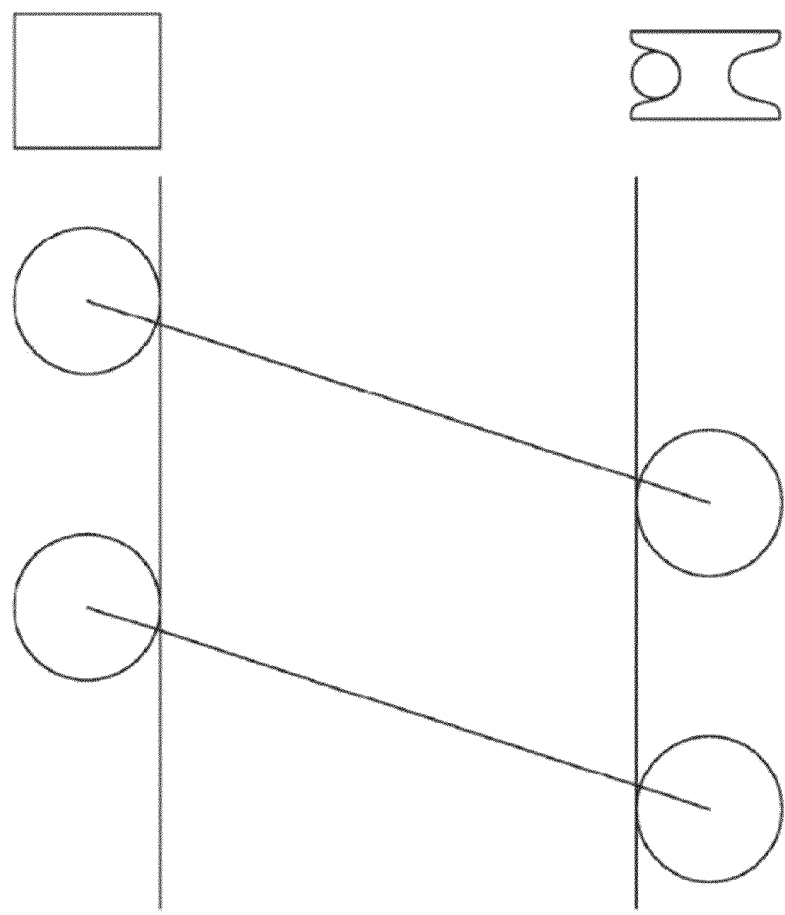
Figure 8C:
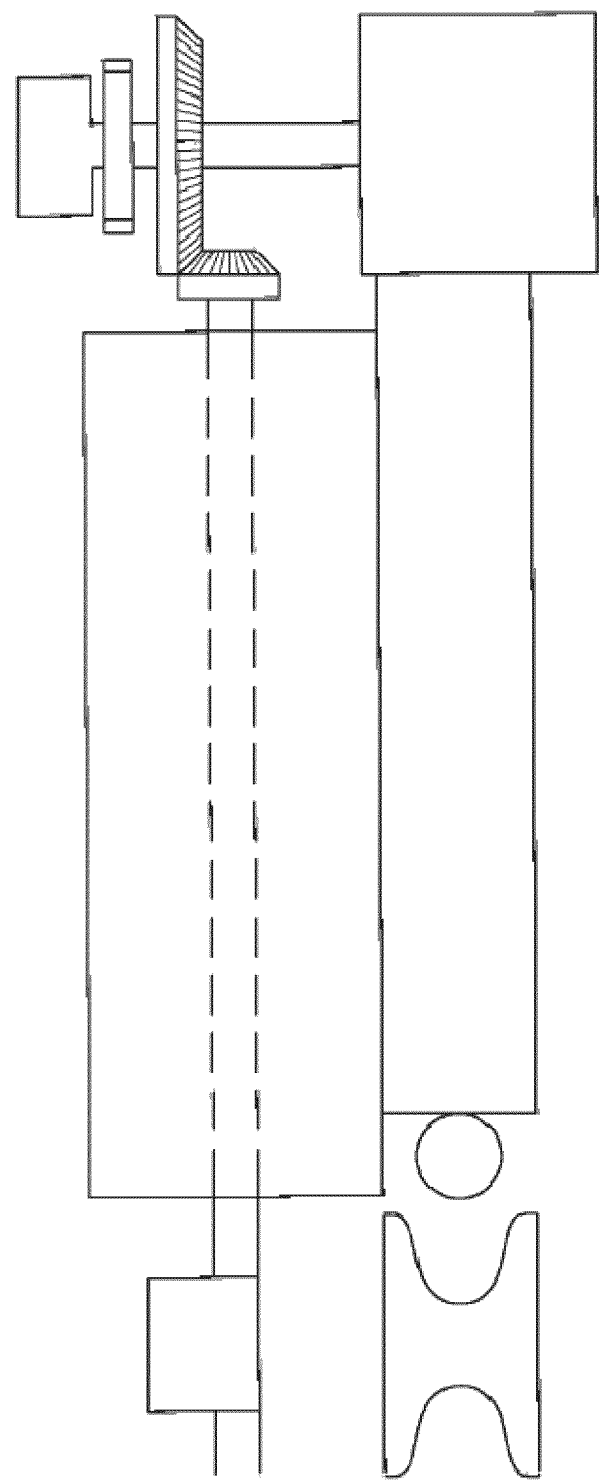
Figure 8D:
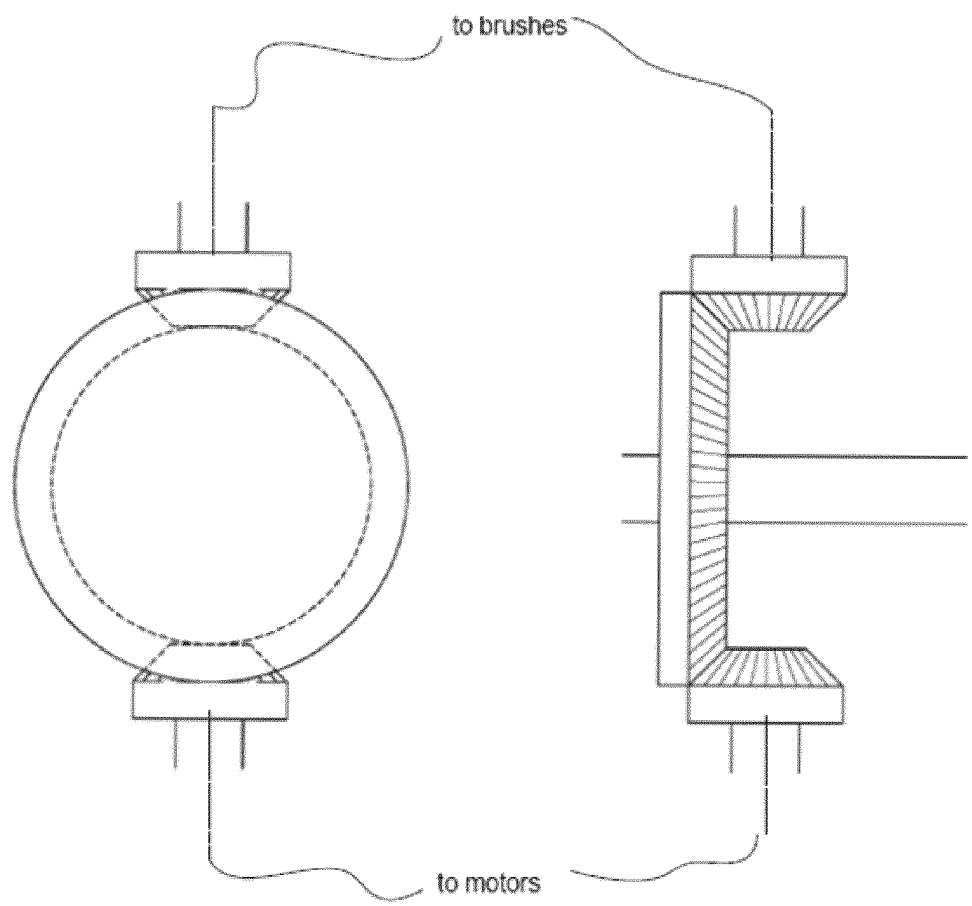

FIG. 8B shows the solar panel cleaning system 800 with the rotatable brushes in a run position. FIG. 8C shows a side view of the solar panel cleaning system 800. One embodiment of the bevel gearbox 802 is shown in FIG. 8D.

Figure 9:
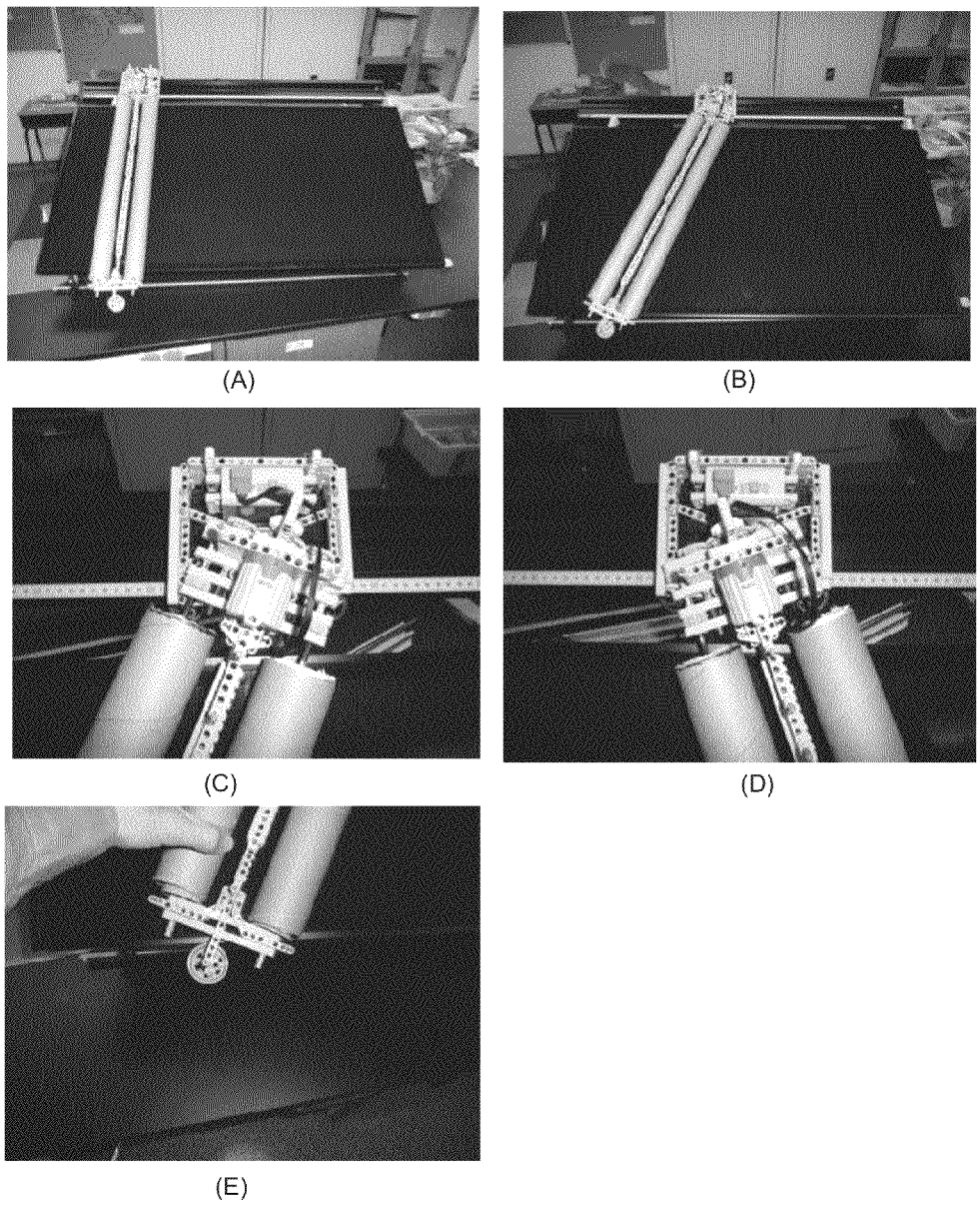
FIGS. 9A-9E illustrate various parts of one embodiment of a solar panel cleaning system.

FIG. 9 illustrates one embodiment of the solar panel cleaning system. The rotatable brushes 104 are shown in a rest position (A) and run position (B). The first drive assembly 116 is shown to be rotating the rotatable brushes 104 clockwise (C) and counter-clockwise (D). An embodiment of the support structure 112 is also illustrated.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

What is claimed is:

1. A solar panel cleaning apparatus comprising:
   one or more rotatable brushes each having a rotational axis;
   a track coupled to the one or more rotatable brushes and configured to guide the one or more rotatable brushes along a path, where the path is in a direction of travel, wherein the direction of travel is not perpendicular to the rotational axis; and
   a drive configured to move each of the one or more rotatable brushes in the direction of travel.

2. The solar panel cleaning apparatus of claim 1, where the system is configured such that the angle of the rotational axis of at least one of the one or more rotatable brushes is adjustable relative to the direction of travel.

3. The solar panel cleaning apparatus of claim 1, further comprising a rotation drive coupled to the one or more rotatable brushes and configured to rotate the one or more rotatable brushes.

4. The solar panel cleaning apparatus of claim 1, further comprising a support assembly configured to support the one or more brushes.

5. The solar panel cleaning apparatus of claim 1, where the drive comprises one or more motors.

6. The solar panel cleaning apparatus of claim 5, where the one or more motors are configured to operate the rotatable brushes.

7. The solar panel cleaning apparatus of claim 1, where each of the one or more rotatable brushes comprises:
   a shaft extending along the rotational axis; and
   a sweeping member coupled to the shaft and configured to be rotatable about the rotational axis.

8. The solar panel cleaning apparatus of claim 7, wherein the angle between the shaft and the direction of travel is ninety (90) degrees in a rest position, and wherein the angle between the shaft and the direction of travel is less than or greater than ninety (90) degrees in a run position.

9. The solar panel cleaning apparatus of claim 3, wherein the rotation drive comprises a worm drive.

10. The solar panel cleaning apparatus of claim 4, wherein the support assembly comprises one or more thrust slide bearings.

11. The solar panel cleaning apparatus of claim 1, further comprising a dock coupled to the support assembly and configured to shelter the one or more brushes.

12. A solar panel cleaning system, comprising:
   a solar panel power system comprising one or more solar panels; and
   a solar panel cleaning apparatus coupled to the one or more solar panels, comprising:

one or more rotatable brushes each having a rotational axis;

a track coupled to the one or more rotatable brushes and configured to guide the one or more rotatable brushes along a path, where the path is in a direction of travel that is not perpendicular to the rotational axis; and a drive configured to move each of the one or more rotatable brushes in the direction of travel.

13. The solar panel cleaning system of claim 12, where the system is configured such that the angle of the rotational axis of at least one of the one or more rotatable brushes is adjustable relative to the direction of travel.

14. The solar panel cleaning system of claim 12, further comprising a rotation drive coupled to the one or more rotatable brushes and configured to rotate the one or more rotatable brushes.

15. The solar panel cleaning system of claim 12, further comprising a support assembly configured to support the one or more brushes.

16. The solar panel cleaning system of claim 12, where the drive comprises one or more motors.

17. The solar panel cleaning system of claim 16, where the one or more motors are configured to operate the rotatable brushes.

18. The solar panel cleaning system of claim 12, where each of the one or more rotatable brushes comprises:

a shaft extending along the rotational axis; and a sweeping member coupled to the shaft and configured to be rotatable about the rotational axis.

19. The solar panel cleaning system of claim 12, wherein the angle between the one or more brushes and the direction of travel is between zero (0) and ninety (90) degrees.

20. The solar panel cleaning system of claim 14, wherein the rotation drive comprises a worm drive.

21. The solar panel cleaning system of claim 15, wherein the support assembly comprises one or more thrust slide bearings.

22. The solar panel cleaning system of claim 12, further comprising a dock coupled to the support assembly and configured to shelter the one or more brushes.

23. A method for cleaning solar panels, comprising:

rotating one or more rotatable brushes around a rotational axis such that the one or more rotatable brushes contact the one or more solar panels;

guiding the one or more rotatable brushes along a path with a track, where the path is in a direction of travel that is not perpendicular to the rotational axis; and moving the one or more rotatable brushes in the direction.

24. The method of 23, where the one or more rotatable bushes are adjustable such that the one or more rotatable brushes are not perpendicular to the direction of travel.

25. The method of claim 23, further comprising supporting, with a support assembly, the one or more rotatable brushes.

26. The method of claim 23, further comprising operating the one or more rotatable brushes with one or more motors.

27. The method of claim 24, further comprising adjusting the one or more rotatable brushes such that the angle between the one or more rotatable brushes and the direction of travel is between zero (0) and ninety (90) degrees.

28. The method of claim 23, further comprising lowering the one or more rotatable brushes such that the one or more rotatable bushes are in contact with a surface of the one or more solar panels.

29. The method of claim 23, further comprising stopping the one or more rotatable brushes after a cleaning process.

30. The method of claim 23, further comprising resting the one or more rotatable brushes in a dock after a cleaning process.

* * * * *